United States Patent
Bauer et al.

(10) Patent No.: US 7,795,727 B2
(45) Date of Patent: Sep. 14, 2010

(54) SEMICONDUCTOR MODULE HAVING DISCRETE COMPONENTS AND METHOD FOR PRODUCING THE SAME

(75) Inventors: Michael Bauer, Nittendorf (DE); Alfred Haimerl, Sinzing (DE); Angela Kessler, Regensburg (DE); Joachim Mahler, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 372 days.

(21) Appl. No.: 11/697,191

(22) Filed: Apr. 5, 2007

(65) Prior Publication Data
US 2007/0235865 A1 Oct. 11, 2007

(30) Foreign Application Priority Data
Apr. 5, 2006 (DE) .................. 10 2006 016 345

(51) Int. Cl.
*H01L 23/34* (2006.01)
(52) U.S. Cl. .............. 257/723; 257/E25.013; 257/686; 257/724; 438/109
(58) Field of Classification Search .......... 257/E25.013, 257/E25.029, 685, 686, 723, 724, 777; 361/760, 361/790, 792; 438/109, 126, 127
See application file for complete search history.

(56) References Cited

U.S. PATENT DOCUMENTS

| | | | | |
|---|---|---|---|---|
| 5,905,639 A * | 5/1999 | Warren | ......... | 361/776 |
| 6,313,598 B1 * | 11/2001 | Tamba et al. | ......... | 318/722 |
| 6,621,155 B1 | 9/2003 | Perino et al. | | |
| 6,753,205 B2 * | 6/2004 | Halahan | ......... | 438/107 |
| 6,762,488 B2 * | 7/2004 | Maeda et al. | ......... | 257/686 |
| 6,815,254 B2 * | 11/2004 | Mistry et al. | ......... | 438/108 |
| 6,828,665 B2 * | 12/2004 | Pu et al. | ......... | 257/686 |
| 6,952,047 B2 * | 10/2005 | Li | ......... | 257/678 |
| 7,026,709 B2 * | 4/2006 | Tsai et al. | ......... | 257/686 |
| 7,034,388 B2 * | 4/2006 | Yang et al. | ......... | 257/686 |
| 7,176,506 B2 * | 2/2007 | Beroz et al. | ......... | 257/232 |
| 7,196,407 B2 * | 3/2007 | Takahashi | ......... | 257/686 |
| 7,279,795 B2 * | 10/2007 | Periaman et al. | ......... | 257/777 |
| 7,435,619 B2 * | 10/2008 | Shim et al. | ......... | 438/107 |
| 7,445,962 B2 * | 11/2008 | Choi et al. | ......... | 438/109 |
| 7,456,495 B2 * | 11/2008 | Pohl et al. | ......... | 257/686 |
| 7,518,226 B2 * | 4/2009 | Cablao et al. | ......... | 257/686 |
| 7,535,086 B2 * | 5/2009 | Merilo et al. | ......... | 257/676 |
| 7,550,832 B2 * | 6/2009 | Weng et al. | ......... | 257/685 |
| 7,557,443 B2 * | 7/2009 | Ye et al. | ......... | 257/723 |
| 7,569,918 B2 * | 8/2009 | Gerber et al. | ......... | 257/676 |
| 2002/0027295 A1 * | 3/2002 | Kikuma et al. | ......... | 257/780 |

(Continued)

FOREIGN PATENT DOCUMENTS

DE     10 220538     11/2003

(Continued)

*Primary Examiner*—Chris Chu
(74) *Attorney, Agent, or Firm*—Dicke, Billig & Czaja, PLLC

(57) ABSTRACT

The invention relates to a semiconductor module comprising stacked discrete components and a method for producing the same. In one embodiment, the semiconductor module has a semiconductor chip arranged on a wiring substrate. The discrete components are arranged and wired on an intermediate carrier, which is electrically connected to the wiring substrate and/or the semiconductor chip. The wiring substrate carries the semiconductor chip, the semiconductor chip carries the intermediate carrier and the intermediate carrier carries the discrete components.

14 Claims, 12 Drawing Sheets

U.S. PATENT DOCUMENTS

| | | | |
|---|---|---|---|
| 2004/0063246 A1* | 4/2004 | Karnezos | 438/108 |
| 2004/0145039 A1* | 7/2004 | Shim et al. | 257/678 |
| 2004/0173914 A1* | 9/2004 | Kurihara et al. | 257/778 |
| 2005/0104196 A1 | 5/2005 | Kashiwazaki | |
| 2006/0076665 A1* | 4/2006 | Kim et al. | 257/686 |
| 2006/0244117 A1* | 11/2006 | Karnezos et al. | 257/678 |
| 2006/0244157 A1* | 11/2006 | Carson | 257/787 |
| 2007/0246815 A1* | 10/2007 | Lu et al. | 257/686 |

FOREIGN PATENT DOCUMENTS

| | | |
|---|---|---|
| DE | 10 2004 036909 | 3/2006 |
| WO | 2006061673 | 6/2006 |
| WO | 2006097779 | 9/2006 |

* cited by examiner

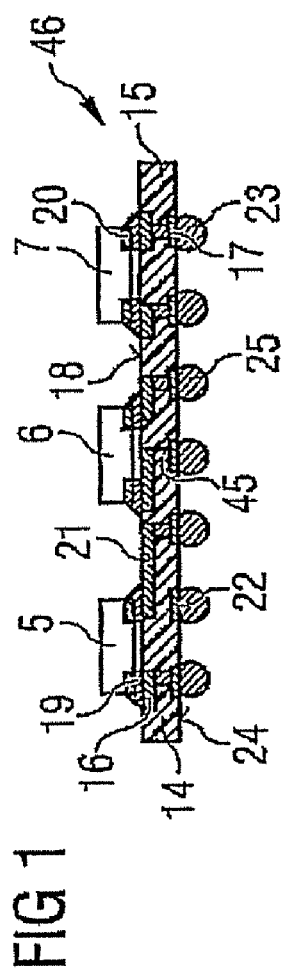
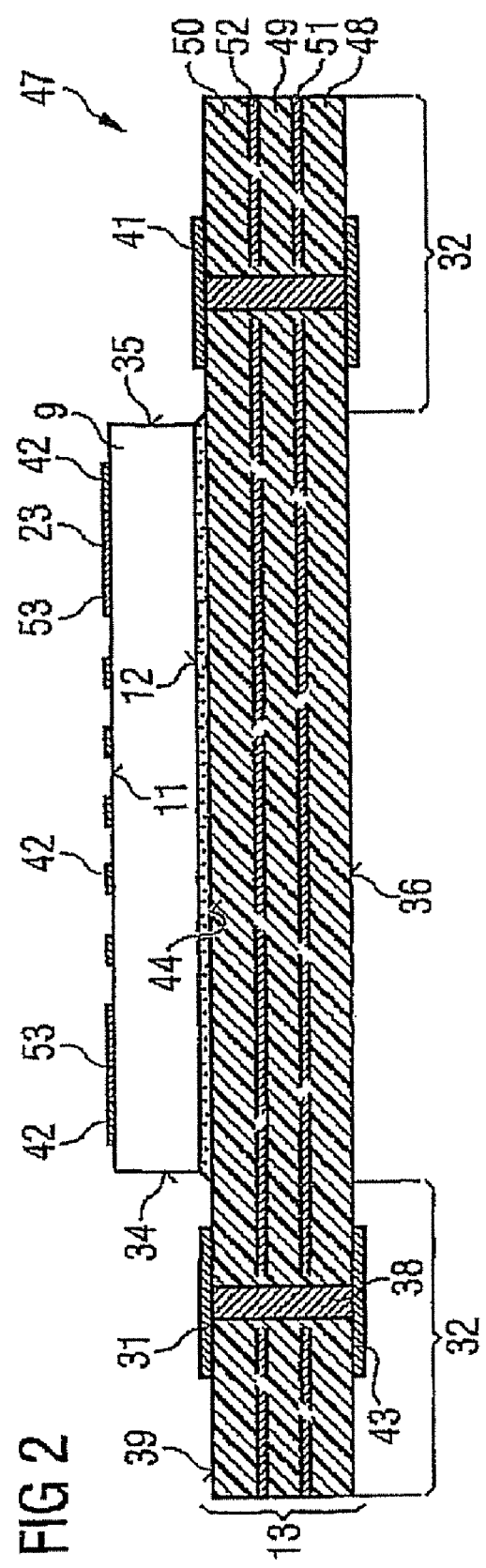

US 7,795,727 B2

SEMICONDUCTOR MODULE HAVING DISCRETE COMPONENTS AND METHOD FOR PRODUCING THE SAME

CROSS-REFERENCE TO RELATED APPLICATIONS

This Utility Patent Application claims the benefit of the filing date of German Application No. DE 10 2006016 345.1, filed Apr. 5, 2006, which is herein incorporated by reference.

BACKGROUND

The invention relates to a semiconductor module comprising discrete components in a housing, wherein the semiconductor module has at least one semiconductor chip. The semiconductor chip is arranged by its rear side on a wiring substrate electrically connected to the semiconductor chip.

A semiconductor module is known from the document DE 102 20 538 A1 which discloses an electronic device as a multichip module. In one embodiment, the multichip module has at least one stacked passive component mounted on a coplanar area composed of top sides of semiconductor chips and of the top side of a plastic composition into which the semiconductor chips are embedded by their rear sides and edge sides. One disadvantage of the known multichip module including a stacked passive component is that the correct function of the passive component can only be tested after the complete construction of the multichip module.

The document U.S. Pat. No. 6,621,155 B1 discloses a multichip module having a semiconductor chip stack with passive components as matching impedances. The passive components are stacked on the topmost semiconductor chip, or fixed on the topmost semiconductor chip, and are electrically connected to the semiconductor chips of the semiconductor chip stack via wiring. The multichip module including stacked passive components has the disadvantage that there is only a limited possibility of arranging passive components in the multichip module. Furthermore the multichip module has the disadvantage that the mode of operation and the functionality of the passive components can only be tested after the assembly of the entire multichip module.

For these and other reasons, there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 1 illustrates a schematic cross section through a stackable auxiliary module with discrete components on an intermediate carrier for a semiconductor module of a first embodiment.

FIG. 2 illustrates a schematic cross section through a base module with at least one semiconductor chip on a wiring substrate for the semiconductor module in accordance with the first embodiment.

DETAILED DESCRIPTION

Figure 3:
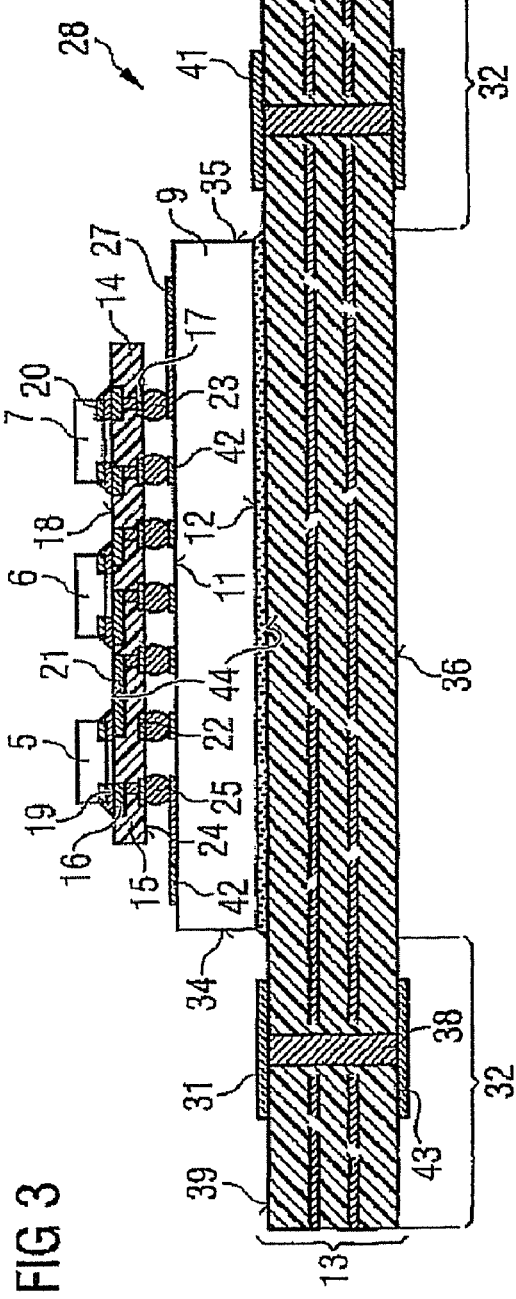
FIG. 3 illustrates a schematic cross section through a stack composed of the base module according to FIG. 2 and the auxiliary module in accordance with FIG. 1.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One or more embodiments provide a semiconductor module including discrete components in a housing, wherein the semiconductor module has at least one semiconductor chip, and the semiconductor chip is arranged by its rear side on a wiring substrate to which the semiconductor chip is electrically connected. Furthermore, one or more embodiments provide a semiconductor module which overcomes the disadvantages in the prior art and can be produced in a cost-effective method.

One or more embodiments provide a semiconductor module including stacked discrete components. A method for producing the semiconductor module is furthermore specified. The semiconductor module has a housing and, in the housing, at least one semiconductor chip having an active top side and a rear side. The semiconductor chip is arranged on a wiring substrate electrically connected to the semiconductor chip. The discrete components are arranged and wired on an intermediate carrier, which is electrically connected to the wiring substrate and/or the semiconductor chip. In this case, the wiring substrate carries the semiconductor chip, the semiconductor chip carries the intermediate carrier and the intermediate carrier carries the discrete components.

With a semiconductor module of this type, no additional space requirement on the wiring substrate is necessary for the discrete components of the semiconductor module that are required, with the result that design-expedient and cost-effective wiring substrates can be used as the wiring substrate. Further, a good thermal linking prevails between the semiconductor chip and the wiring substrate since the semiconductor chip is carried by its rear side over the whole area by the substrate.

With this module, the discrete components can be electrically tested beforehand on the intermediate carrier as a quasi-passive module. By virtue of the fact that no discrete components have to be mounted on the wiring substrate, the substrate does not become contaminated either, for example, by flux such as would be necessary during the soldering process. The next advantage is decisive primarily for radiofrequency modules, since it is possible to effect the shortest possible electrical connection of the discrete components on the intermediate carrier toward the semiconductor chip. Even if the intermediate carrier with the discrete components is larger in area than the surface of the semiconductor chip, it is possible, by using a spacer or by using large solder balls on the underside of the intermediate carrier, for the intermediate carrier with the discrete components to project beyond the semiconductor chip upon stacking, without adversely affecting the functionality of the semiconductor module composed of discrete components and a semiconductor chip.

Furthermore, the clear separation between a wiring substrate with at least one semiconductor chip and an intermediate carrier on which all exclusively discrete components are arranged is advantageous, especially as the intermediate carrier may be self-supporting and be assembled in independent method processes in parallel with the wiring substrate, which reduces the costs of the semiconductor module. Moreover, the subject matter of the invention exploits the fact that the areal extent of the semiconductor chips is constantly increasing, with the result that the semiconductor chips are able to carry an intermediate plate with applied discrete components on their top side. Consequently, the semiconductor module according to the invention inverts the previous hybrid technology in which large-area passive components have hitherto been used as carriers for extremely small semiconductor chips, whereas according to the invention, in contrast, the semiconductor chip now performs the carrier function for a number of passive components.

In one embodiment of the invention, the intermediate carrier has a self-supporting wiring plate with wiring. Consequently, it is possible to populate the intermediate carrier together with the discrete components, which constitute passive components such as resistors, transistors or capacitors or else active components such as individual transistors or individual diodes and fuses against overvoltage or overcurrent.

Consequently, the intermediate carrier has contact areas for the connection of the discrete components, conductor tracks for the internal and external wiring of the discrete components and contact pads for the connection of connecting elements between the intermediate carrier and the wiring substrate and/or the semiconductor chip. In this case, the contact pads for the connecting elements may be arranged on the top side of the intermediate carrier and/or on the underside of the intermediate carrier.

In a further embodiment of the invention, the intermediate carrier has on its top side the discrete components, which are fixed on contact areas, and on its underside it has flip-chip contacts or solder balls on corresponding contact pads. The flip-chip contacts or solder balls here form the connecting elements to a wiring structure on the top side of the semiconductor chip, in which case the wiring structure of the semiconductor chip may be applied to the individual semiconductor chip of a wafer as early as during wafer production.

If, in one embodiment, the areal extent of the intermediate carrier parallel to the top side of the semiconductor chip is smaller than the top side of the semiconductor chip itself, the intermediate carrier can be electrically connected to the semiconductor chip via the flip-chip contacts. Relatively small connecting elements in comparison with solder balls can be produced in space-saving fashion by the flip-chip contacts as connecting elements between intermediate carrier and carrying semiconductor chip.

In a further embodiment, it is provided that the areal extent of the intermediate carrier is larger than the areal extent of the top side of the semiconductor chip. In this case, solder balls, which are usually used as external contacts, can be used here for bridging a distance between semiconductor chip and intermediate carrier so that enough space remains for connecting contact areas on the top side of the semiconductor chip to contact pads on a wiring substrate via bonding wires. The use of solder balls means that the semiconductor chip can be used, despite its smaller areal extent, as a carrier for an intermediate carrier having a larger areal extent.

In a further embodiment, the intermediate carrier has no solder balls or flip-chip contacts, but rather is arranged on the top side of the semiconductor chip having a larger areal extent. An intermediate carrier of this type, which is carried by its rear side by the top side of the semiconductor chip, has on its top side a wiring with contact pads in edge regions, which are electrically connected via bonding wire connecting elements to contact pads in edge regions of the wiring substrate. It is also possible to directly connect individual bonding elements directly between the contact pads of the intermediate carrier on the top side of the semiconductor chip to contact areas of the semiconductor chip.

This embodiment thus has the advantage that a freely selectable combination of connections between the intermediate carrier, the semiconductor chip and the wiring substrate is possible with the aid of the bonding technology. These various connecting lines can be planned, decided and realized, in principle, shortly before the embedding or introduction of the stack composed of wiring substrate, the semiconductor chip, intermediate carrier and discrete components.

This is particularly advantageous for semiconductor modules in the context of ASIC semiconductor device fabrications.

In a further embodiment, the areal extent of the intermediate carrier is larger than the areal extent of the semiconductor chip carrying the intermediate carrier. In order, in such a case, to mount an intermediate carrier having a larger areal extent than the areal extent of the semiconductor chip on the top side of the semiconductor chip, this solution provides a passive or electrically conductive spacer, the areal extent of which is in turn smaller than that of the semiconductor chip. The intermediate carrier is thereby held at a distance from the semiconductor chip, with the result that bonding wire connections of the semiconductor chip to the wiring substrate are not impaired.

In this embodiment, the intermediate carrier with contact pads on its top side can then finally be connected to corresponding contact pads of the wiring structure on the top side of the wiring substrate after the mounting of the semiconductor chip, the connecting elements for the semiconductor chip and after the mounting of the spacer with intermediate carrier and applied discrete components.

The intermediate carrier described above for the individual embodiments consequently enables a multiplicity of different design configurations.

In a further embodiment it is provided that the semiconductor module has external contacts which are arranged on the underside of the wiring substrate and are surface-mountable for mounting on a superordinate circuit board. The external contacts of the semiconductor module on the underside of the wiring substrate are electrically connected to the contact pads on the top side of the wiring substrate via through contacts through the wiring substrate. In this case, the contact pads are electrically connected via connecting elements to the semiconductor chip and/or to the discrete components on the intermediate carrier. In this embodiment, it is unimportant whether the intermediate carrier is then fixed with the aid of flip-chip contacts, solder balls and/or directly by its underside on the top side of the semiconductor chip and is thus carried by the semiconductor chip.

The housing can be embodied in diverse ways. The housing has a plastic composition into which the semiconductor chip, the intermediate carrier with discrete components and partly the wiring substrate, in particular by its top side, are embedded. In this case, the intermediate carrier and/or the wiring substrate may be an insulating plastic plate equipped with corresponding wiring structures on the top side and/or underside. However, it is also possible for the wiring substrate and/or the intermediate carrier to include a ceramic, which is advantageous for radiofrequency components. In the case of the radio-frequency components and/or also the power components, it may be advantageous for the housing to have a cavity, in which the semiconductor chip, the intermediate carrier with the discrete components and partly the wiring substrate are arranged.

A first method of a plurality of method variants for producing a semiconductor module including stacked discrete components has the following method processes. The first process involves producing a wiring substrate with a wiring structure on its top side and through contacts to its underside. In parallel with this, semiconductor chips of a semiconductor wafer are provided with a wiring structure on their top sides and the semiconductor wafer is subsequently separated into individual semiconductor chips. Finally, the wiring substrate is populated with the correspondingly prepared semiconductor chips with a wiring structure on their top sides.

In parallel with these two preparatory processes of producing a wiring substrate and producing a corresponding semiconductor chip with a wiring structure on its top side, an intermediate carrier with wiring is produced, the areal extent of which is smaller than the areal extent of the semiconductor chip. The intermediate carrier is additionally populated with discrete components on its top side and flip-chip contacts on its underside. After preparation of these three main components of a semiconductor module, the intermediate carrier is electrically connected on to the top side of the semiconductor chip with cohesive connection of the flip-chip contacts of the intermediate carrier to the wiring structure on the top side of the semiconductor chip.

It is then possible to effect the production of bonding wire connections between contact areas on the top side of the semiconductor chip to contact pads of the wiring substrate, especially as the contact areas on the semiconductor chip are freely accessible for the fitting of bonding wire connections. This arrangement composed of stacked wiring structure carrying a semiconductor chip, the semiconductor chip in turn carrying an intermediate carrier and the intermediate carrier for its part having discrete components, is then introduced with semiconductor chip and discrete components into a housing.

This method has reduced liability risks since soldering in of passive or discrete components on the wiring substrate, on which at least one semiconductor chip has already been fixed, is obviated. Moreover, the wiring substrate can be made smaller in terms of its area requirement since the discrete components are wired and fixed on a special intermediate carrier. Finally, there is the possibility, on account of the flip-chip contacts for the intermediate carrier, to test this completely mounted intermediate carrier via the flip-chip contacts electrically in terms of its functionality, in particular with regard to the discrete components, before the intermediate carrier with the discrete components is fixed on to a wiring structure of the top side of the semiconductor chip.

A second method of a plurality of method variants for producing a semiconductor module including stacked discrete components initially has the same method processes for producing a wiring substrate populated with a semiconductor chip. During the production of the intermediate carrier, two features are characteristic, firstly that the areal extent of the intermediate carrier is larger than the top side of the semiconductor chip, with the result that the application of the intermediate carrier with discrete components on its top side can be effected only after the production of bonding wire connections between contact areas on the top side of the semiconductor chip and contact pads of the wiring substrate.

In contrast to the first method variant, it is necessary for bonding wires to be fitted before the intermediate carrier is applied to the top side of the semiconductor chip with cohesive connection of the solder balls to the intermediate carrier. Moreover, the solder balls having a larger volume in comparison with the smaller flip-chip contacts are used here in order to ensure a sufficient distance between the bonding wire connections and the projecting intermediate carrier plate having a larger area, with the result that the bonding wire connections that already then exist are not damaged during application of the intermediate carrier plate. Afterward, the stack composed of semiconductor chips and discrete components can then be introduced into a housing, as in the first method variant.

These first two method variants together have the advantage that bonding wire connections are necessary only between the contact areas of the semiconductor chip and the contact pads of the wiring substrate, since the electrical connection between the intermediate carrier and the discrete components is effected via the flip-chip contacts or, in the second method variant, via solder balls.

A third method of a plurality of method variants for producing a semiconductor module including stacked discrete components initially has the same method processes for producing a wiring substrate and for populating the wiring substrate with at least one semiconductor chip. This third method variant provides for the intermediate carrier to have neither flip-chip contacts nor solder balls on its underside, rather for the intermediate carrier to have on its top side a wiring structure with contact pads on the edge regions of the intermediate carrier.

At the same time, the intermediate carrier is intended to have a smaller areal extent than the areal extent of the top side of the semiconductor chip. In this third method variant, an intermediate carrier of this type is firstly populated with discrete components on its top side, and the intermediate carrier can subsequently be applied to the top side of the semiconductor chip with cohesive connection of the underside of the intermediate carrier to the top side of the semiconductor chip.

One advantage is that the semiconductor chip does not have to have an additional wiring structure on its top side, coordinated with the intermediate carrier, rather that the intermediate carrier can now be fixed by its rear side directly on the top side of the semiconductor chip whilst leaving free the contact areas on the top side of the semiconductor chip.

Afterward, the contact areas of the semiconductor chip which are freely accessible are then connected to contact pads of the wiring substrate, and, finally it is also possible for contact pads of the wiring of the intermediate carrier to be connected to contact pads of the wiring substrate.

This method has the advantage that all wire connections both between semiconductor chip and wiring substrate and between intermediate carrier and wiring substrate can be carried out by one wiring process. Finally, this finished wired stack composed of semiconductor chip and discrete components can be introduced into a housing.

This method gives rise to a semiconductor module which has the additional advantage over the previous two methods that the structural height is smaller since the intermediate carrier can be fixed directly on the top side of the semiconductor chip, especially as its areal extent is smaller than the areal extent of the semiconductor chip. Furthermore it has the advantage that no additional wiring structure is required on the top side of the semiconductor chip. Connecting elements in the form of flip-chip contacts and/or solder balls do not have to be provided either. As a result, the costs of completing such a semiconductor module simultaneously become lower than the costs of the previous two method variants.

A fourth method of a plurality of method variants for producing a semiconductor module including stacked discrete components once again has the same method processes as the third method variant for the production of the wiring substrate and population of the wiring substrate with a corresponding semiconductor chip. However, the fourth method variant differs from the third method variant by virtue of the fact that an intermediate carrier with discrete components is provided, the areal extent of which is larger than the areal extent of the top side of the semiconductor chip. In this case, an adaptor plate is additionally provided for maintaining spacing between the top side of the semiconductor chip and the underside of the intermediate carrier.

Moreover, the contact areas of the semiconductor chip are connected to contact pads of the wiring substrate via corresponding bonding wire connections prior to the application of the intermediate carrier. This means that the connection of contact pads of a wiring of the intermediate carrier to contact pads of the wiring substrate can be effected if the intermediate carrier has been effected on to the spacer plate with cohesive connection of the underside of the intermediate carrier to the spacer plate. This concludes the wiring and the stack composed of wiring substrate, semiconductor chip, spacer, intermediate carrier and discrete components and the stack can then be introduced into a housing.

For all four variants, for the production of the wiring substrate, a wiring structure is structured on the top side and on the underside of the wiring substrate. The wiring structure on the top side is equipped with contact pads for connecting elements to the semiconductor chip. Moreover, the contact pads are connected via conductor tracks to through contacts through the wiring substrate. External contact areas for the semiconductor module are provided on the underside of the wiring substrate, which are electrically connected to the through contacts via conductor tracks of the wiring structure of the underside.

A wiring substrate of this type ensures that the semiconductor module has surface-mountable external contact areas to which, if necessary, it is also possible to apply external contacts in the form of solder bumps or solder balls and/or solder deposits. In the case of the first two method variants, provision is made for structuring a wiring structure on the top side of the semiconductor chip in a manner matching the flip-chip contacts or the solder balls of the intermediate carrier. This production of a wiring structure on the top side of the semiconductor chip is carried out simultaneously for a plurality of semiconductor chips on the top side of a semiconductor wafer and is then available after the separation of the semiconductor wafer on the individual semiconductor chips for the application of flip-chip contacts or solder balls of the intermediate carrier.

During the population of the wiring substrate with the semiconductor chip, the semiconductor chip is fixed by its rear side on a chip mounting area of the top side of the wiring structure by the rear side of the semiconductor chip being soldered on or applied by a conductive adhesive.

While in the case of the last two method variants, namely the third and fourth method variants, an intermediate carrier can be used which only has a wiring on its top side, for the production of the intermediate carrier in the first two method variants, a wiring structure is structured on the top side and on the underside. In this case, the intermediate carrier is equipped on its top side with contact areas for the discrete components. The contact areas are connected via conductor tracks to through contacts through the intermediate carrier, and the through contacts are connected on the underside of the intermediate carrier to contact pads for flip-chip contacts or solder balls. The position of the solder balls or the flip-chip contacts is aligned with contact areas of an additional wiring structure on the top side of the semiconductor chip. During the mounting of the intermediate carrier on the top side of the semiconductor chip, the flip-chip contacts are finally cohesively connected to the contact areas. Finally, the intermediate carrier is populated with discrete components by the electrodes of the discrete components being soldered or adhesively bonded by a conductive adhesive on contact areas on the top side of the intermediate carrier.

The invention will now be explained in more detail with reference to the accompanying figures.

FIG. 1 illustrates a schematic cross section through a stackable auxiliary module 46 including discrete components 5, 6 and 7 on an intermediate carrier 14 for a semiconductor module of a first embodiment of the invention. In this first embodiment, the intermediate carrier 14 has a wiring 16 on the top side 18 and a wiring 17 on the underside 24. The wiring 16 on the top side 18 is connected to the wiring 17 on the underside 24 via through contacts 45 through the intermediate carrier 14, which is formed as a wiring plate 15. The wiring 16 on the top side 18 of the intermediate carrier 14 has contact areas 19 arranged in such a way that electrodes 20 of the discrete components 5, 6 and 7 can be cohesively connected to the contact areas 19. Moreover, the wiring 16 on the top side 18 of the intermediate carrier 14 has conductor tracks 21 which electrically connect the contact areas 19 to the through contacts 45.

The wiring 17 on the underside 24 of the intermediate carrier 14 has contact pads 22 for connecting elements 23, which are flip-chip contacts 25 in this first embodiment. The discrete components 5, 6 and 7 on the top side 18 of the self-supporting wiring plate 15 of the auxiliary module 46 may be passive components such as resistors, capacitors or inductances or may have active discrete components such as, for example diodes or transistors, in particular radio-frequency transistors, or protective diodes. In this first embodiment, the areal extent of the top side 18 or of the underside 24 of the wiring plate 15 is smaller than the areal extent of a semiconductor chip intended to carry this auxiliary module 46 on its top side.

FIG. 2 illustrates a schematic cross section through a base module 47 with at least one semiconductor chip 9 on a wiring substrate 13 for the semiconductor module in accordance with the first embodiment. For this purpose, the wiring substrate 13 has on its underside 36 which simultaneously represents the underside of the semiconductor module, external contact areas 43 provided for fitting external contacts of the semiconductor module. The external contact areas 43 are electrically connected via through contacts 38 to contact pads 31 on the top side 39 of the wiring substrate 13. The external contact areas 43 and the contact pads 31 are arranged in edge regions 32 of the wiring substrate 13, in which case the wiring substrate may be embodied in multilayer fashion and have further structured metal layers 51 and 52 between insulation layers 48, 49 and 50.

The contact pads 31 are elements of a wiring structure 41 on the top side 39 of the wiring substrate 13, the wiring structure 41 having a chip mounting area 44 in the centre of the top side 39 of the wiring substrate 13, on which chip mounting area at least one semiconductor chip 9 of the base module 47 is fixed cohesively by its rear side 12. This cohesive fixing may have a solder connection and/or a conductive adhesive connection if the chip mounting area 44 is a metal area to which the rear side 12 of the semiconductor chip 9 is intended to be electrically connected.

Arranged on the top side 11 of the semiconductor chip is an additional wiring structure 27, which on the one hand has contact areas 42 adapted in size and arrangement to the flip-chip contacts of the auxiliary module 46 illustrated in FIG. 1 and additionally has contact areas 42 in edge regions of the semiconductor chip 9, which are provided for connecting elements. Arranged between the contact areas 42 in the edge regions and the contact areas 42 for the flip-chip contacts 25, which are illustrated in FIG. 1, are conductor tracks 53 which connect the central contact areas 42 to the contact areas 42 in the edge region of the semiconductor chip 9.

FIG. 3 illustrates a schematic cross section through a stack 28 composed of the base module 47 in accordance with FIG. 2 and the auxiliary module 46 in accordance with FIG. 1 after the application of the auxiliary module 46 to the top side 11 of the semiconductor chip 9. Since the auxiliary module 46 is smaller in terms of the areal extent of the intermediate carrier 14 than the top side 11 of the semiconductor chip 9, edge regions of the semiconductor chip 9 remain freely accessible, the contact areas 42 for connecting elements of the wiring structure 27 being situated on the edge regions. Consequently, it is possible to produce bonding wire connections from the contact areas 42 in edge regions of the semiconductor chip 9 to contact pads 31 of the wiring substrate 13.

Figure 4:
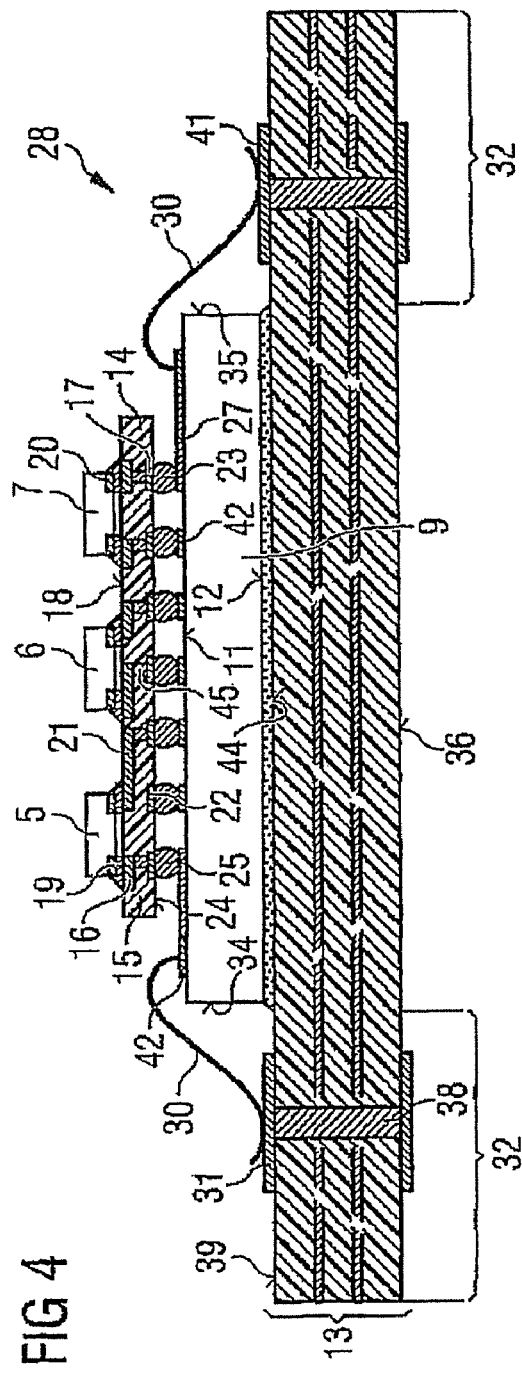
FIG. 4 illustrates a schematic cross section through the stack in accordance with FIG. 3 after the application of bonding wire connections.

FIG. 4 illustrates a schematic cross section through the stack 28 in accordance with FIG. 3 after the application of bonding wire connections 30. Via the bonding wire connections 30 as connecting elements between the contact pads 31 on the top side 39 of the wiring substrate 13 and the contact areas 42 in edge regions of the semiconductor chip 9, the discrete components 5, 6 and 7 of the stack 28 are also electrically connected to the external contact areas 43 of the wiring substrate 13 and hence of the semiconductor module.

Figure 5:
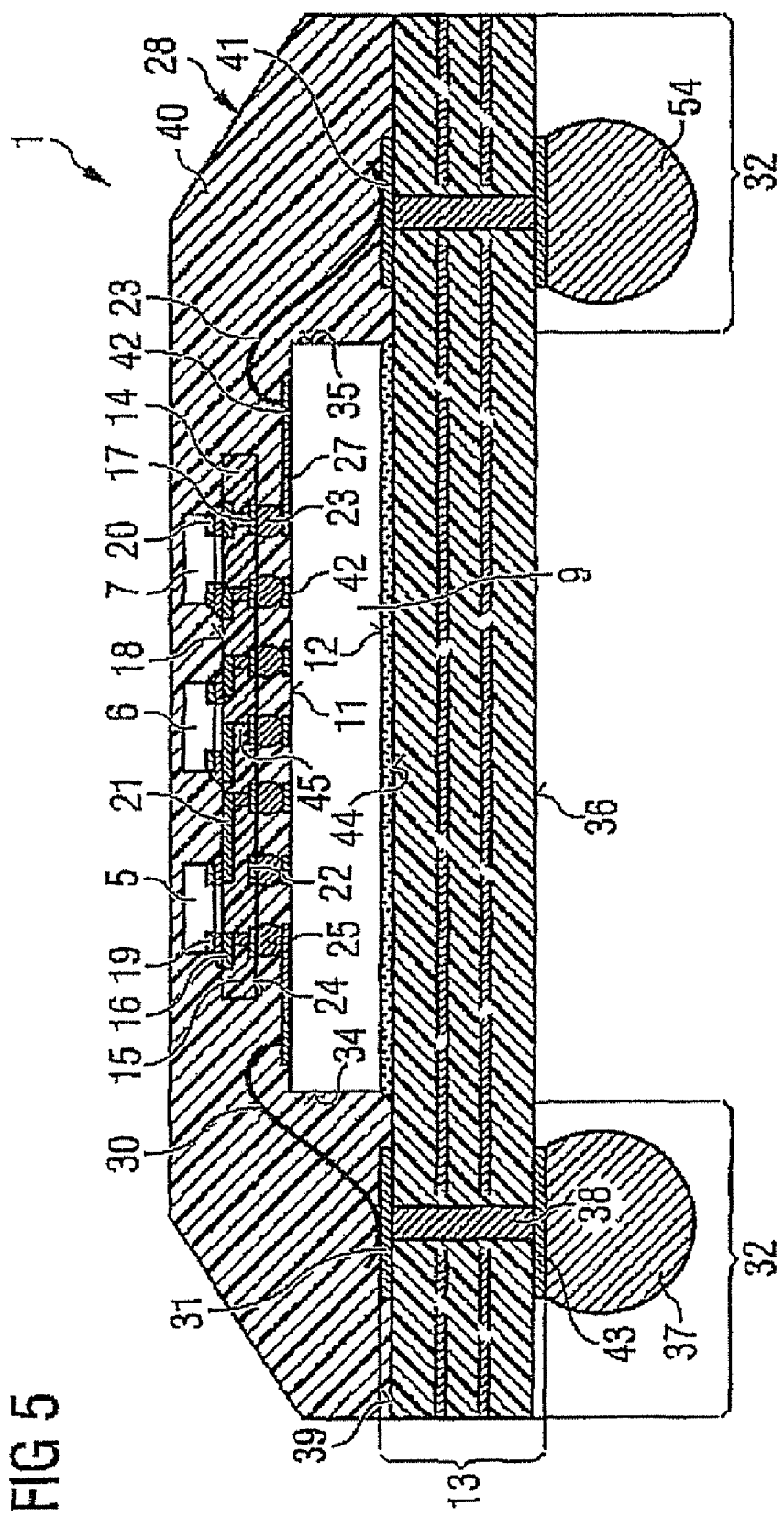
FIG. 5 illustrates a schematic cross section through a semiconductor module in accordance with the first embodiment.

FIG. 5 illustrates a schematic cross section through a semiconductor module 1 in accordance with the first embodiment of the invention. Components having the same functions as in previous figures are identified by the same reference symbols and are not discussed separately. In order to complete the semiconductor module 1, the stack 28 as illustrated in FIG. 4 is provided with a plastic housing composition 40, into which are embedded the discrete components 5, 6 and 7, the intermediate carrier 14, the semiconductor chip 9 and the connecting elements 23 and also the top side 39 of the wiring substrate 13. In this embodiment of the invention, solder balls 54 as external contacts 37 are arranged on to the external contact areas 43 in the edge regions 32 of the underside 36.

In the subsequent FIGS. 6 to 17, three further embodiments are discussed with their construction and their assembly in order to elucidate the invention. In this case, components having the same functions as in FIGS. 1-5 are identified by the same reference symbols and are not discussed separately.

Figure 6:
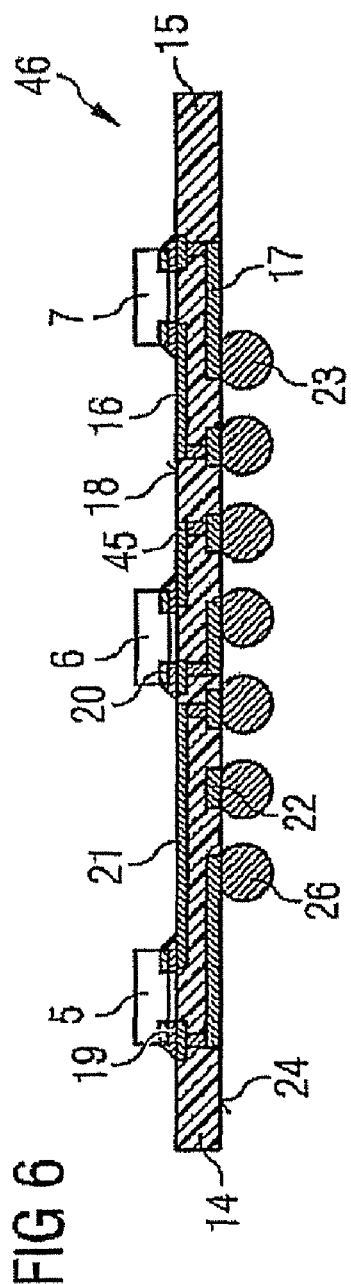
FIG. 6 illustrates a schematic cross section through a stackable auxiliary module with discrete components on an intermediate carrier for a semiconductor module of a second embodiment.

FIG. 6 illustrates a schematic cross section through a stackable auxiliary module 46 including discrete components 5, 6 and 7 on an intermediate carrier 14 for a semiconductor module of a second embodiment. The difference from the auxiliary module 46 illustrated in FIG. 1 is that the areal extent of the intermediate carrier 14 of the auxiliary module 46 is larger than the areal extent of a top side of a semiconductor chip provided for carrying the intermediate carrier 14. In order to ensure that the planned bonding wire connections for connecting a semiconductor chip to a wiring substrate are not damaged by the auxiliary module 46 having a larger areal extent, solder balls 26 rather than flip-chip contacts are provided in this second embodiment of the invention, the solder balls having a significantly larger diameter and therefore ensuring a larger interspace for the accommodation of bonding wire connections between semiconductor chip and intermediate carrier.

Figure 7:
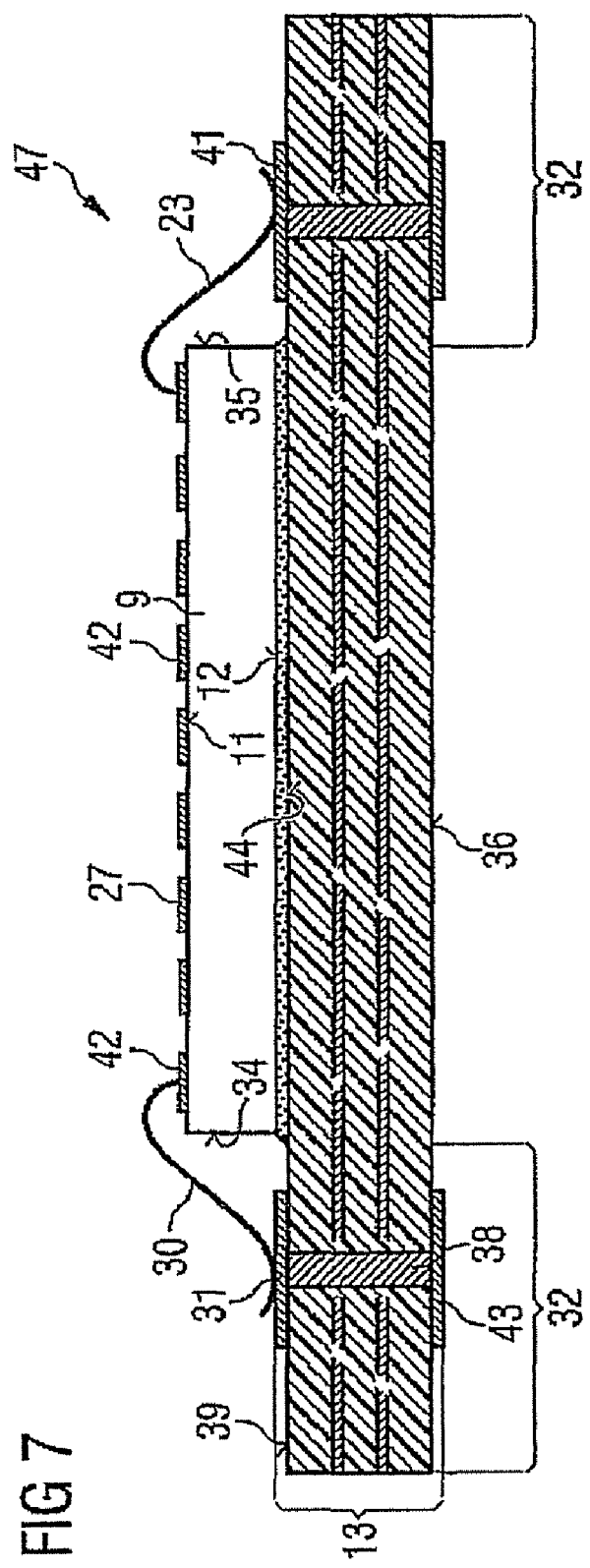
FIG. 7 illustrates a schematic cross section through a base module with at least one semiconductor chip on a wiring substrate for the semiconductor module in accordance with the second embodiment.

FIG. 7 illustrates a schematic cross section through a base module 47 with at least one semiconductor chip 9 on a wiring substrate 13 for the semiconductor module in accordance with the second embodiment after the fitting of bonding wire connections 30 between contact areas 42 in the edge region of the semiconductor chip 9 and contact pads 31 on the top side 39 of the wiring substrate 13. Since the areal extent of the auxiliary module 46 illustrated in FIG. 6 is larger than the areal extent of the top side 11 of the semiconductor chip 9, bonding wire connections 30 for the base module 47 are produced before the auxiliary module 46 is actually applied to the top side 11 of the semiconductor chip 9 between the contact areas 42 on the top side 11 of the semiconductor chip 9 and the contact pads 31 on the top side 39 of the wiring substrate 13. Only afterward can the auxiliary carrier 46 be stacked on the top side 11 of the semiconductor chip 9.

Figure 8:
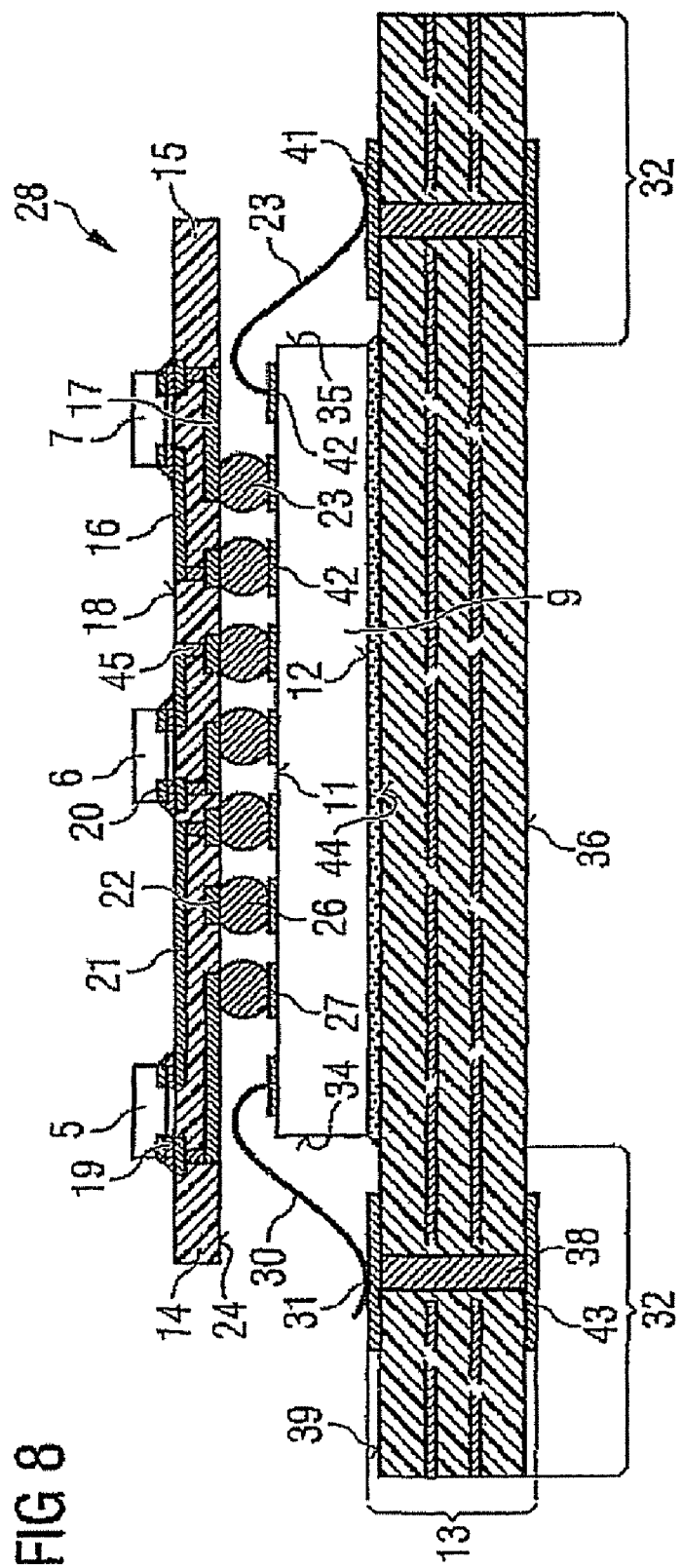
FIG. 8 illustrates a schematic cross section through a stack composed of the base module according to FIG. 7 and the auxiliary module in accordance with FIG. 6.

FIG. 8 illustrates a schematic cross section through a stack 28 composed of the base module 47 in accordance with FIG.

7 and the auxiliary module 46 in accordance with FIG. 6 after the application of the auxiliary module 46 to the top side 11 of the semiconductor chip 9. The solder balls 26 representing the connecting elements 23 between the auxiliary module 46 and the base module 47 in FIG. 8 ensure an interspace between the underside 24 of the intermediate carrier 14 and the top side 11 of the semiconductor chip 9, which ensures the bonding connections 30 between contact areas 42 of the semiconductor chip 9 and the contact pads 41 on the top side 39 of the wiring substrate 13.

Figure 9:
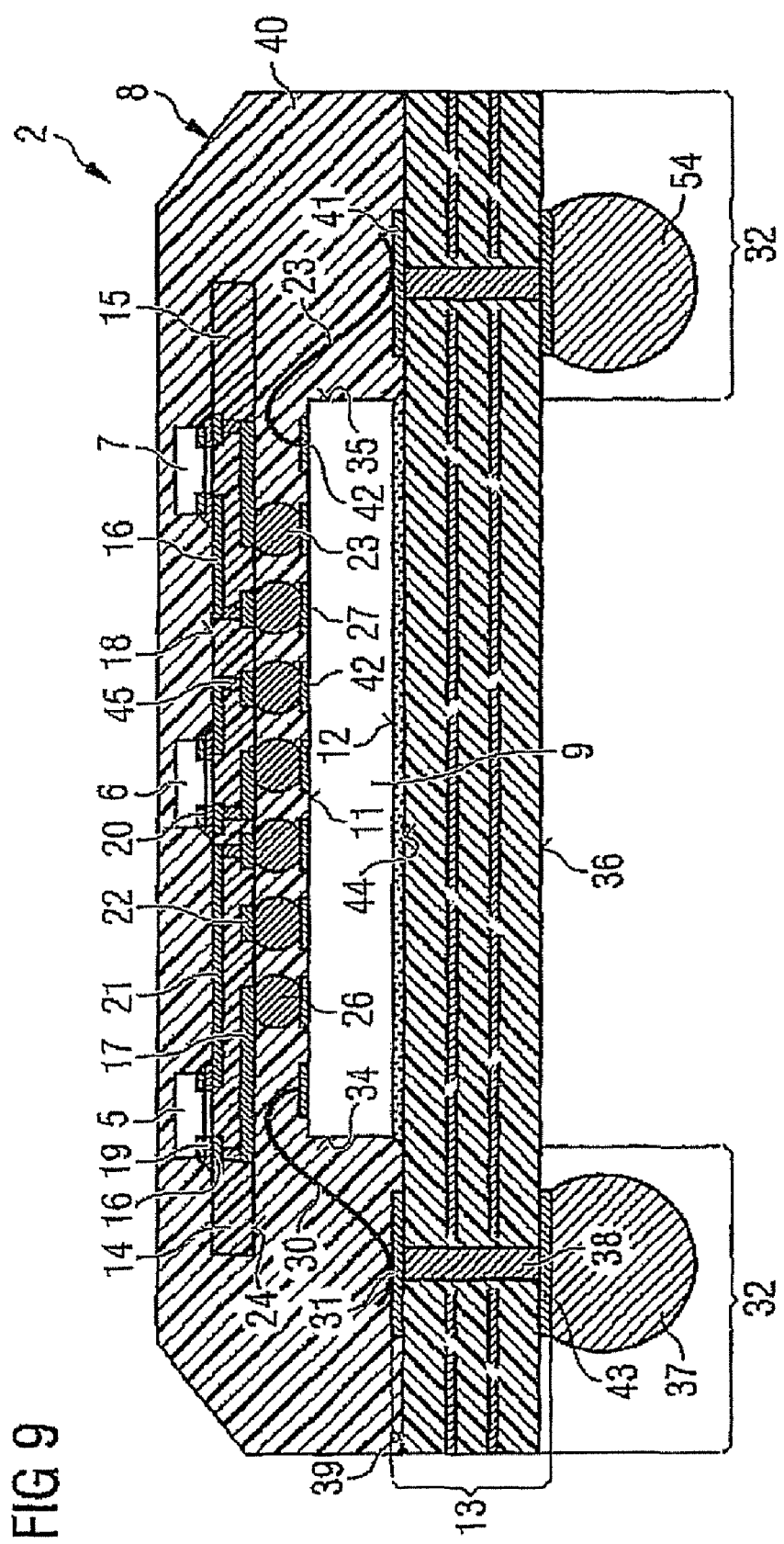
FIG. 9 illustrates a schematic cross section through a semiconductor module in accordance with the second embodiment.

FIG. 9 illustrates a schematic cross section through a semiconductor module 2 in accordance with a second embodiment after the application of a plastic composition 40 with embedding of the semiconductor chip 9, the intermediate carrier 14 carried by the semiconductor chip 9, and the discrete components 5, 6 and 7 that are in turn carried by the intermediate carrier. Moreover, external contacts 37 are fitted on the underside 36 of the wiring substrate 13 in order to enable surface mounting of the now finished semiconductor module 2 on a superordinate circuit board (not shown).

Figure 10:
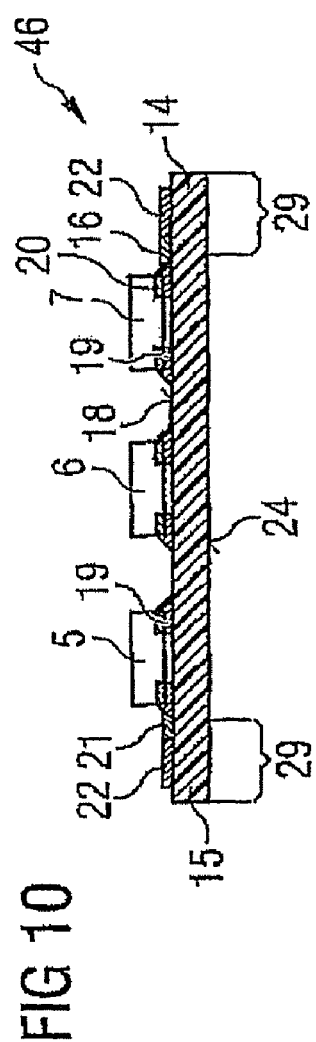
FIG. 10 illustrates a schematic cross section through a stackable auxiliary module with discrete components on an intermediate carrier for a semiconductor module of a third embodiment.

FIG. 10 illustrates a schematic cross section through a stackable auxiliary module 46 including discrete components 5, 6 and 7 on an intermediate carrier 14 for a semiconductor module of a third embodiment. This intermediate carrier 14 differs from the previous intermediate carriers in FIGS. 1 and 6 by virtue of the fact that the intermediate carrier has no wiring structure on the underside 24 and also no flip-chip contacts or solder balls on the underside 24. It is only on the top side 18 that there are arranged conductor tracks 21 and contact areas 19 for the electrodes 20 of the discrete components 5, 6 and 7 and also contact pads 22 for fitting connecting elements in the edge regions 29 of the intermediate carrier 14. The intermediate carrier 14 can therefore be manufactured more cost-effectively since it has a wiring structure 16 only on one side.

Figure 11:
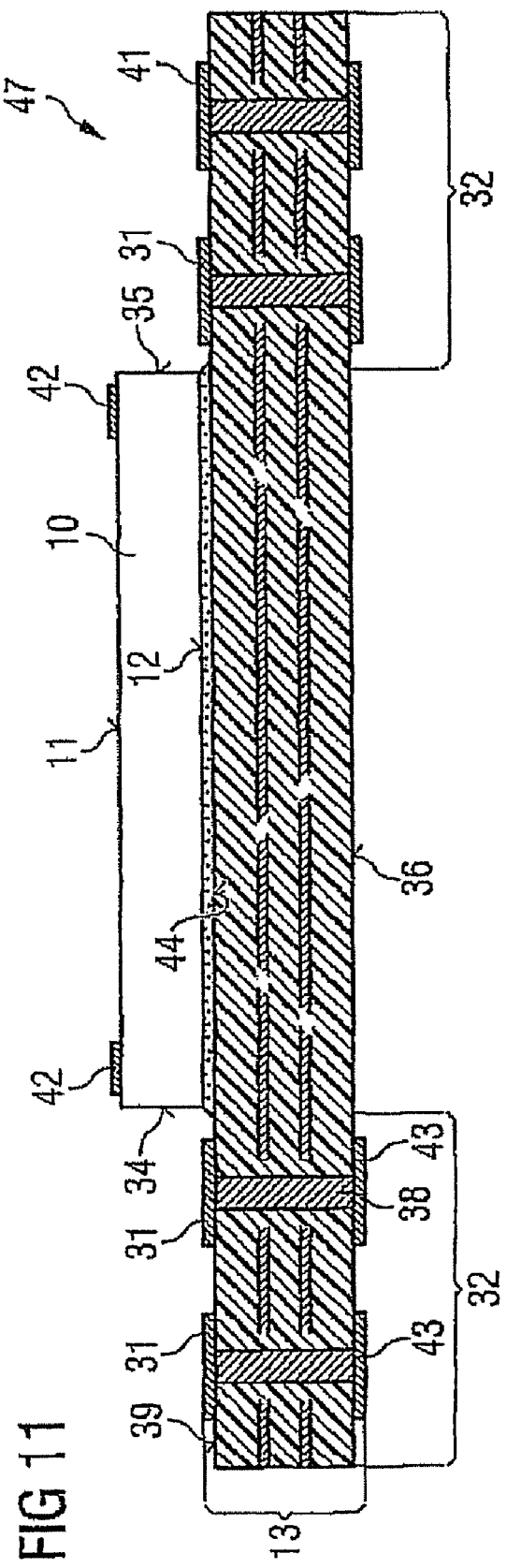
FIG. 11 illustrates a schematic cross section through a base module with at least one semiconductor chip on a wiring substrate for the semiconductor module in accordance with the third embodiment.

FIG. 11 illustrates a schematic cross section through a base module 47 with at least one semiconductor chip 10 on a wiring substrate 13 for the semiconductor module in accordance with the third embodiment. In the case of this base module it is possible to use a semiconductor chip 10 which does not require an additional wiring structure on its top side 11 but rather only has the customary contact areas 42 in edge regions of the semiconductor chip 10. This, too, has an economically beneficial effect for the completion of the semiconductor module. Only the wiring substrate 13 has additional contact pads 31 on the top side 29 of the wiring substrate 13 so that both the intermediate carrier 14 and the semiconductor chip 10 can be connected to corresponding contact pads 31 of the wiring substrate 13.

Figure 12:
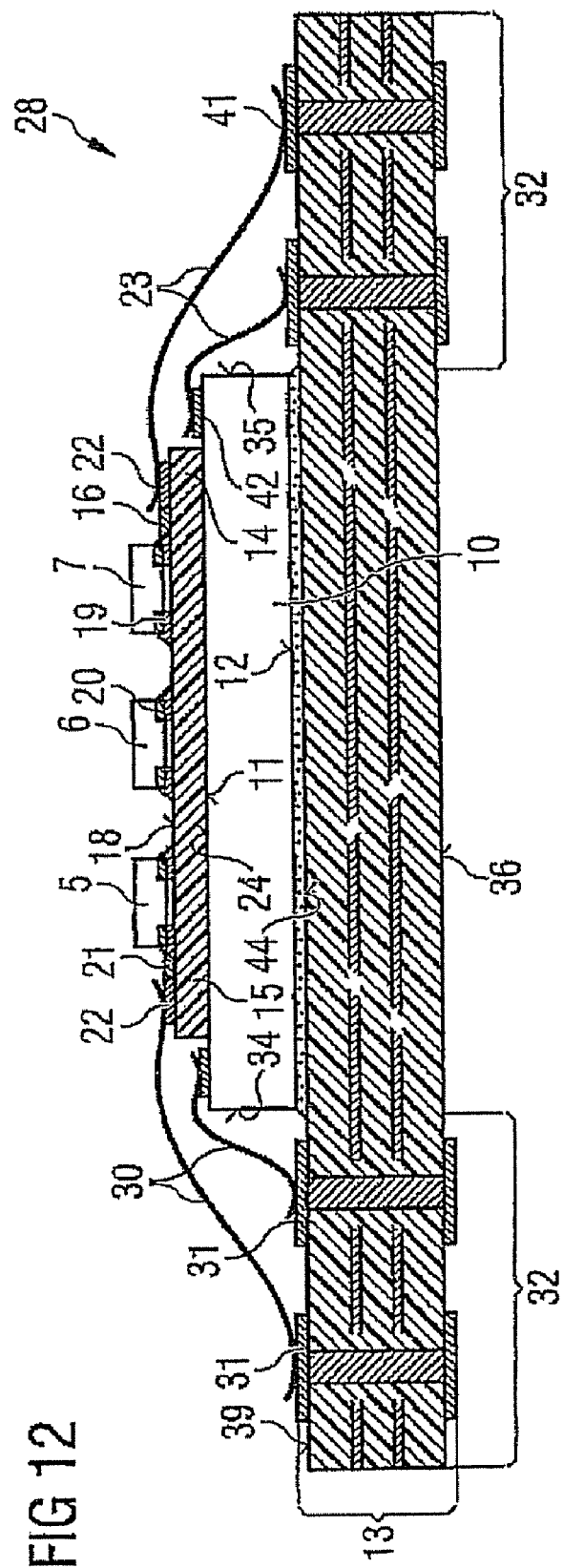
FIG. 12 illustrates a schematic cross section through a stack composed of the base module according to FIG. 11 and the auxiliary module in accordance with FIG. 10.

FIG. 12 illustrates a schematic cross section through a stack 28 composed of the base module 47 in accordance with FIG. 11 and the auxiliary module 46 in accordance with FIG. 10 after the application of the semiconductor module 46 to the top side 11 of the semiconductor chip 10 and the fitting of bonding wire connections 30. For this purpose, the underside [24] is cohesively connected to the top side 11 of the semiconductor chip 10. The bonding wire connections 30 illustrated in FIG. 12 can then be produced. Since both the contact pads 22 of the intermediate carrier 14 and the contact areas 42 of the semiconductor chip are freely accessible, all the bonding wire connections can be effected successively. Moreover, it is possible to fit bonding wires directly between the contact pads 22 of the intermediate carrier 14 and the contact areas 42 of the semiconductor chip, so that it is possible to produce extremely short connections between the components 5, 6 and 7 and corresponding components at the top side 11 of the semiconductor chip 10. Such short bonding wire connections have been omitted for reasons of simplifying the illustration in FIG. 12.

Figure 13:
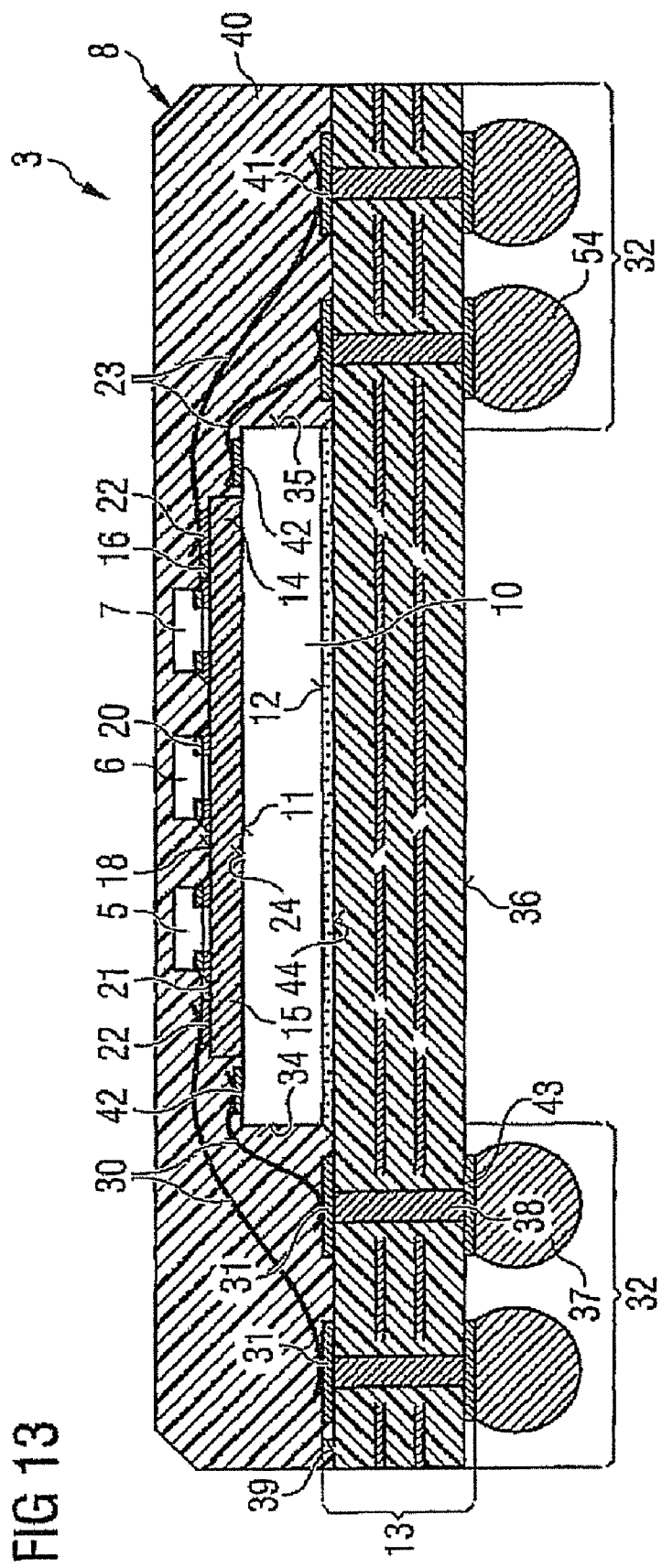
FIG. 13 illustrates a schematic cross section through a semiconductor module in accordance with the third embodiment.

FIG. 13 illustrates a schematic cross section through a semiconductor module 3 in accordance with the third embodiment. In order to accomplish this semiconductor module 3 a plastic composition 40 was merely applied to the top side 39 of the wiring substrate 13 whilst embedding the semiconductor chip 10, intermediate carrier 14 and discrete components 5, 6 and 7 and also the connecting elements 23. Moreover, external contacts 37 in the form of surface-mountable solder balls 54 were soldered on to the underside 36 in the edge region 32.

Figure 14:
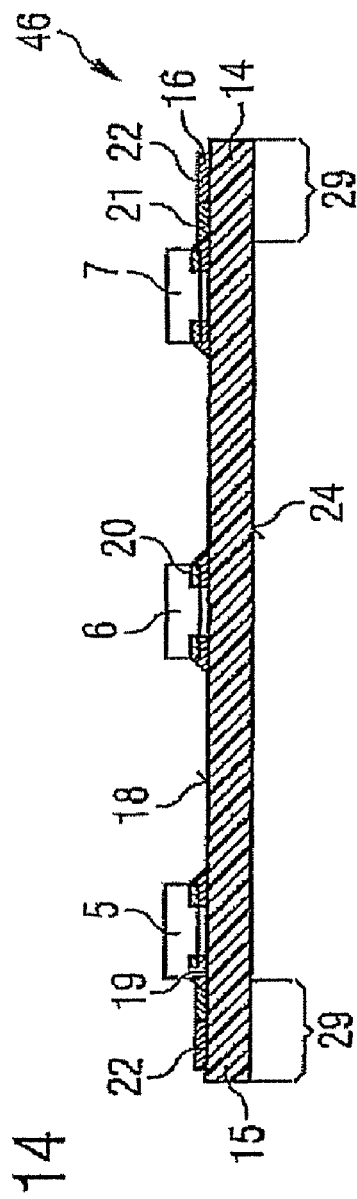
FIG. 14 illustrates a schematic cross section through a stackable auxiliary module with discrete components on an intermediate carrier for a semiconductor module of a fourth embodiment.

FIG. 14 illustrates a schematic cross section through a stackable auxiliary module 46 including discrete components 5, 6 and 7 on an intermediate carrier 14 for a semiconductor module of a fourth embodiment. Components having the same functions as in the previous figures are identified by the same reference symbols and are not discussed separately. The intermediate carrier 14 for the semiconductor module of the fourth embodiment of the invention corresponds in terms of its construction to the intermediate carrier illustrated in FIG. 11, but the areal extent of the intermediate carrier 14 is larger than the areal extent of the surface of the semiconductor chip that is intended to carry the intermediate carrier.

Figure 15:
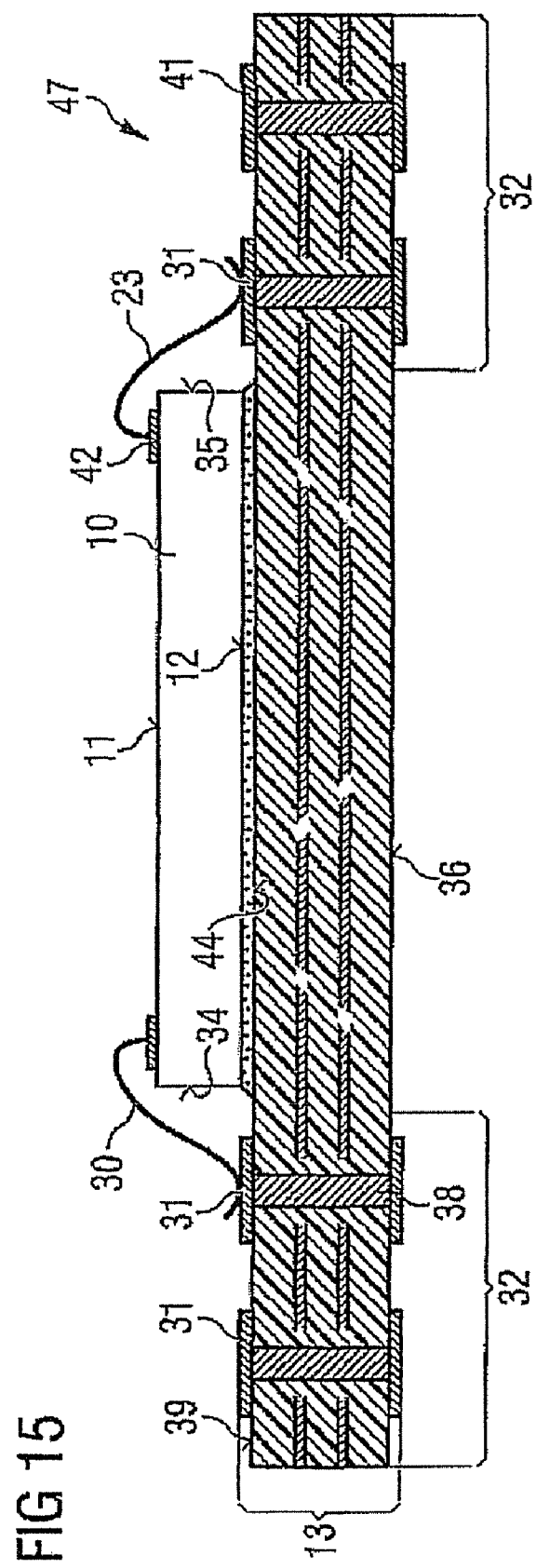
FIG. 15 illustrates a schematic cross section through a base module with at least one semiconductor chip on a wiring substrate for the semiconductor module in accordance with the fourth embodiment of the invention.

FIG. 15 illustrates a schematic cross section through a base module 47 with at least one semiconductor chip 10 on a wiring substrate 13 for the semiconductor module of the fourth embodiment. This base module 47 differs from the base module 47 illustrated in FIG. 11 merely by virtue of the fact that the contact areas 42 in the edge region of the semiconductor chip 10 are already connected via bonding wire connections 30 to contact pads 31 of the wiring substrate 1 before the intermediate carrier 14 illustrated in FIG. 14 can be fixed by its edge regions 29, which project beyond the semiconductor chip 10, on the top side 11 of the semiconductor chip 10. In order to make this possible despite the bonding wire connections 30 that have already been effected, firstly a spacer plate 33, which is illustrated in FIG. 16 is fixed on the top side of the semiconductor chip 10.

Figure 16:
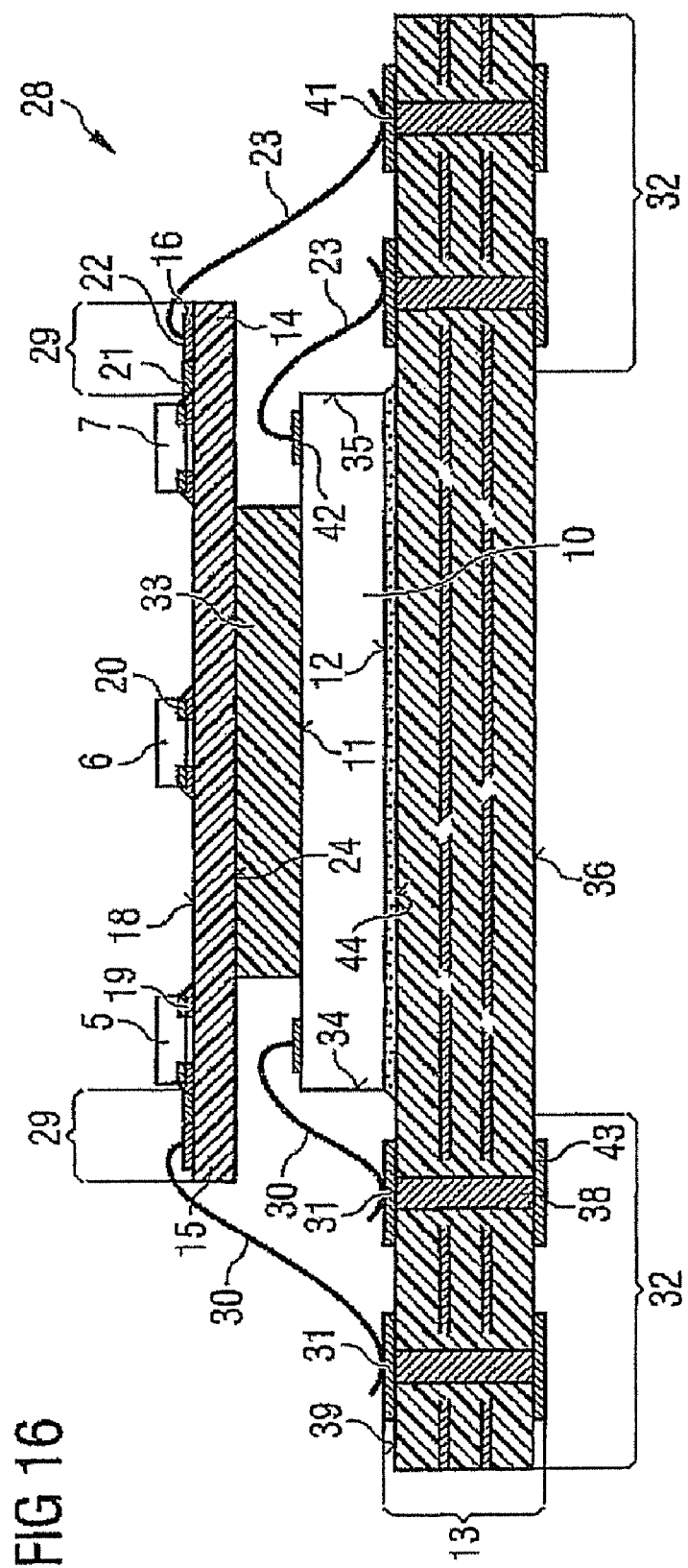
FIG. 16 illustrates a schematic cross section through a stack composed of the base module according to FIG. 15 and the auxiliary module in accordance with FIG. 14.

FIG. 16 illustrates a schematic cross section through a stack 28 composed of the base module 47 in accordance with FIG. 15 and the auxiliary module 46 in accordance with FIG. 14 after the application of the semiconductor module 46 on a spacer plate 33 arranged on the top side 11 of the semiconductor chip 10. The spacer plate 33 serves as a spacer and affords a sufficient interspace for the already mounted bonding wire connections 30 between the semiconductor chip 10 and the wiring structure 13. After the intermediate carrier 14 with the discrete components 5, 6 and 7 and the spacer plate 33 have been mounted on the top side 11 of the semiconductor chip 10, it is then also possible to produce bonding wire connections between contact pads 22 of the wiring 16 on the top side 18 of the intermediate carrier 14 and corresponding prepared contact pads 31 on the top side 39 of the wiring substrate 13.

Figure 17:
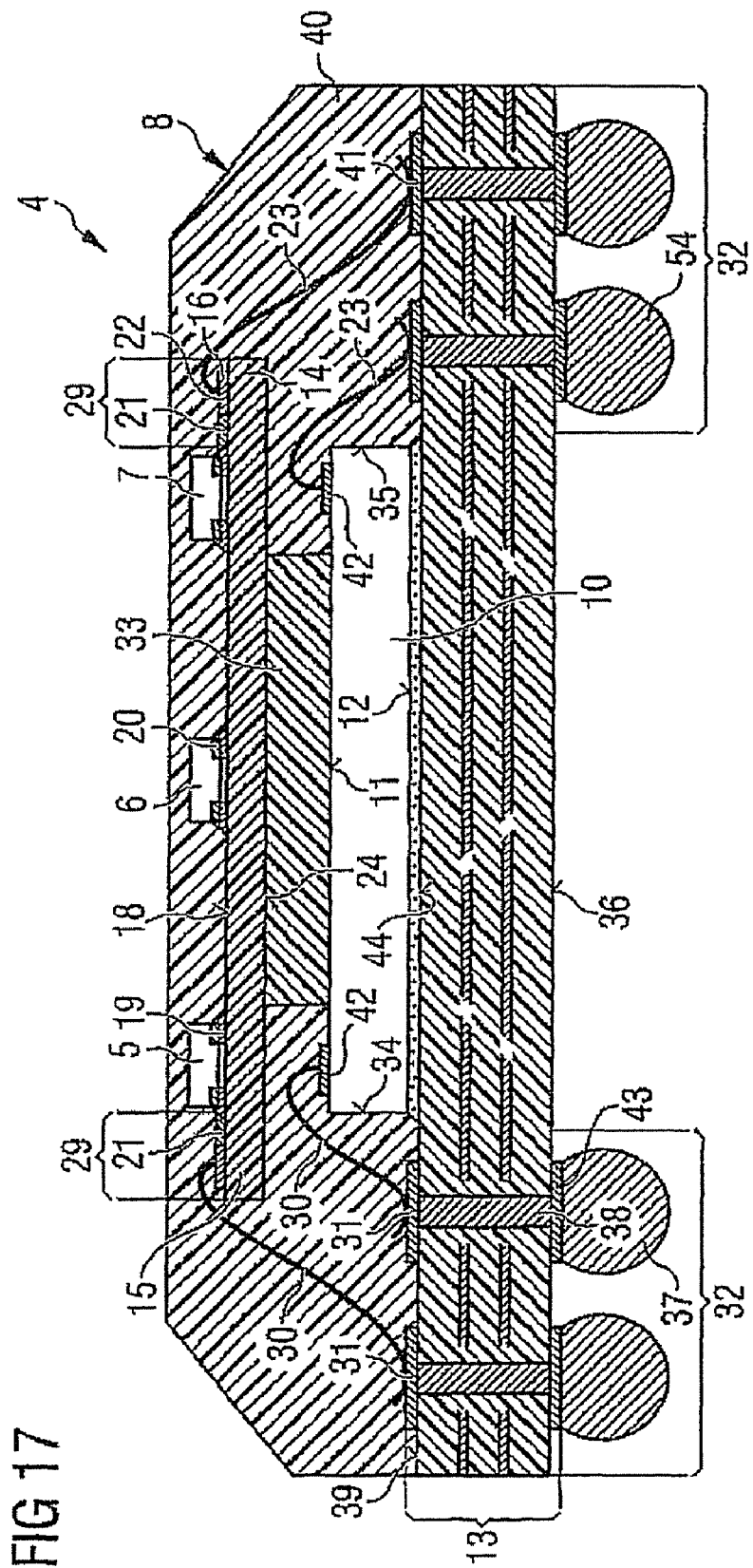
FIG. 17 illustrates a schematic cross section through a semiconductor module in accordance with the fourth embodiment.

FIG. 17 illustrates a schematic cross section through a semiconductor module 4 of a fourth embodiment. Prior to the completion of the semiconductor module 4, once again a plastic composition is applied to the top side 39 of the wiring substrate 13 and embeds the semiconductor chip 10 and its edge sides 34 and 35, the spacer plate 33, the intermediate carrier 14 and the discrete components 5, 6 and 7 arranged thereon. For surface mounting of a semiconductor module of this type, in this fourth embodiment, external contacts 37 are arranged on the external contact areas 34 on the underside 36 of the wiring substrate 13 in the form of solder balls 54.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor module comprising:
a wiring substrate;
a semiconductor chip arranged on the wiring substrate;
an intermediate carrier stacked on the semiconductor chip, wherein discrete components are arranged and wired on the intermediate carrier, and are electrically connected to the wiring substrate and/or the semiconductor chip, wherein the intermediate carrier comprises on its top side the discrete components on contact areas and on its underside flip-chip contacts or solder balls on contact pads and wherein the flip-chip contacts or solder balls are electrically connected as connecting elements to a wiring structure on the top side of the semiconductor chip, and wherein the wiring structure on the top side of the semiconductor chip is electrically connected via bonding wires to a wiring structure on the substrate; and
wherein the wiring substrate carries the semiconductor chip, the semiconductor chip carries the intermediate carrier and the intermediate carrier carries the discrete components.

2. The semiconductor module of claim 1, comprising wherein the intermediate carrier comprises a self-supporting wiring plate with wiring.

3. The semiconductor module of claim 1, comprising wherein the intermediate carrier comprises passive devices as discrete components on its top side.

4. The semiconductor module of claim 1, comprising wherein the intermediate carrier comprises contact areas for the connection of the electrodes of the discrete components, conductor tracks for the internal and external wiring of the discrete components and contact pads for the connection of connecting elements.

5. A semiconductor module having discrete components in a housing, comprising:
a semiconductor chip, which has an active top side and a rear side and is arranged on a wiring substrate electrically connected to the semiconductor chip;
an intermediate carrier stacked on the semiconductor chip, wherein the discrete components are arranged and wired on the intermediate carrier, and is electrically connected to the wiring substrate and/or the semiconductor chip, wherein the intermediate carrier comprises on its top side the discrete components on contact areas and on its underside flip-chip contacts or solder balls on contact pads, and wherein the flip-chip contacts or solder balls are electrically connected as connecting elements to a wiring structure on the top side of the semiconductor chip, and wherein the wiring structure on the top side of the semiconductor chip is electrically connected via bonding wires to a wiring structure on the substrate;
wherein the wiring substrate carries the semiconductor chip, the semiconductor chip carries the intermediate carrier and the intermediate carrier carries the discrete components; and
wherein the housing has a plastic composition into which the semiconductor chip and the intermediate carrier with discrete components are completely embedded and the wiring substrate is at least partly embedded.

6. The semiconductor module of claim 5, comprising wherein the intermediate carrier comprises a self-supporting wiring plate with wiring.

7. The semiconductor module of claim 5, comprising wherein the intermediate carrier comprises passive devices as discrete components on its top side.

8. The semiconductor module of claim 5, comprising wherein the intermediate carrier comprises contact areas for the connection of the electrodes of the discrete components, conductor tracks for the internal and external wiring of the discrete components and contact pads for the connection of connecting elements.

9. The semiconductor module of claim 5, comprising wherein an areal extent of the intermediate carrier is smaller than the top side of the semiconductor chip and the intermediate carrier is electrically connected to the semiconductor chip via the flip-chip contacts.

10. The semiconductor module of claim 5, comprising wherein an areal extent of the intermediate carrier is larger than the top side of the semiconductor chip and the intermediate carrier is electrically connected to the semiconductor chip via the solder balls.

11. The semiconductor module of claim 5, comprising wherein an areal extent of the intermediate carrier is smaller than an areal extent of the semiconductor chip, wherein the intermediate carrier is fixed by its underside on the top side of the semiconductor chip and comprises on its top side a wiring with contact pads in edge regions, which are electrically connected via bonding wire connecting elements to contact pads in edge regions of the wiring substrate.

12. The semiconductor module of claim 5, comprising wherein an areal extent of the intermediate carrier is larger than an areal extent of the semiconductor chip wherein the intermediate carrier is fixed by its underside on a spacer plate to the top side of the semiconductor chip and projects beyond the edges of the semiconductor chip and has on its top side a wiring with contact pads in edge regions, which are electrically connected via bonding wire connecting elements to contact pads in edge regions of the wiring substrate.

13. The semiconductor module of claim 5, comprising wherein the wiring substrate comprises on its underside surface-mountable external contacts which are electrically connected via through contacts to contact pads on the top side of the wiring substrate; and wherein the contact pads are electrically connected via connecting elements to the semiconductor chip and the discrete components on the intermediate carrier.

14. The semiconductor module of claim 5, comprising wherein the wiring substrate and/or the intermediate carrier comprise a ceramic.

* * * * *